United States Patent
Eriksson et al.

(10) Patent No.: US 8,721,789 B2
(45) Date of Patent: May 13, 2014

(54) APPARATUS AND METHOD FOR CRYSTALLIZATION OF SILICON

(75) Inventors: Jan-Erik Eriksson, Vasteras (SE); Olof Hjortstam, Vasteras (SE); Ulf Sand, Vasteras (SE)

(73) Assignee: ABB AB (SE)

( * ) Notice: Subject to any disclaimer, the term of this patent is extended or adjusted under 35 U.S.C. 154(b) by 0 days.

(21) Appl. No.: 13/421,561

(22) Filed: Mar. 15, 2012

(65) Prior Publication Data
US 2012/0167629 A1 Jul. 5, 2012

Related U.S. Application Data

(63) Continuation of application No. PCT/EP2009/062099, filed on Sep. 18, 2009.

(51) Int. Cl.
*C30B 13/30* (2006.01)
*C30B 11/00* (2006.01)
*C30B 13/24* (2006.01)
*C30B 15/30* (2006.01)
*C03B 9/41* (2006.01)

(52) U.S. Cl.
CPC ............... *C30B 13/30* (2013.01); *C30B 11/003* (2013.01); *C30B 13/24* (2013.01); *C30B 15/30* (2013.01); *C03B 9/41* (2013.01)
USPC .............. 117/202; 65/29.18; 65/163; 65/178; 65/33.9

(58) Field of Classification Search
CPC ...... C30B 13/30; C30B 11/003; C30B 13/24; C30B 15/30
USPC ........... 65/29.18, 163, 178, 33.9; 117/39, 202
See application file for complete search history.

(56) References Cited

U.S. PATENT DOCUMENTS

| 4,580,614 A | * | 4/1986 | Haissig ....................... 164/154.5 |
| 4,649,985 A | * | 3/1987 | Mizota et al. .................. 164/468 |

(Continued)

FOREIGN PATENT DOCUMENTS

| DE | 19704075 A1 | 8/1998 |
| FR | 2908125 A1 | 5/2008 |

(Continued)

OTHER PUBLICATIONS

International Search Report and Written Opinion of the International Searching Authority; Application No. PCT/EP2009/062099; Issued: Mar. 19, 2012; Mailing Date: Aug. 5, 2010; 20 pages.

(Continued)

*Primary Examiner* — Michael Kornakov
*Assistant Examiner* — Hua Qi
(74) *Attorney, Agent, or Firm* — St. Onge Steward Johnston & Reens LLC

(57) ABSTRACT

An apparatus for crystallization of silicon includes a crucible for containing silicon, a heating and heat dissipating arrangement provided for melting the silicon contained in the crucible and for subsequently solidifying the molten silicon, and an electromagnetic stirring device provided for stirring the molten silicon in the crucible during the solidification of the molten silicon. A control arrangement is provided for controlling the heating and heat dissipating arrangement to solidify the molten silicon at a specified solidification rate and for controlling the electromagnetic stirring device to stir the molten silicon in response to the specified solidification rate of the molten silicon such that the ratio of a speed of the molten silicon and the specified solidification rate is above a first threshold value.

25 Claims, 2 Drawing Sheets

(56) References Cited

U.S. PATENT DOCUMENTS

| | | |
|---|---|---|
| 6,849,121 B1 | 2/2005 | Iseler et al. |
| 2008/0063025 A1* | 3/2008 | Fishman et al. ............... 373/144 |
| 2009/0155765 A1* | 6/2009 | Atwood et al. .................... 435/3 |

FOREIGN PATENT DOCUMENTS

| | | | | |
|---|---|---|---|---|
| FR | 2909990 A1 | | 6/2008 | |
| JP | H05254817 A | | 10/1993 | |
| JP | H07164119 A | | 6/1995 | |
| JP | 08071716 A | * | 3/1996 | ............ B22D 11/10 |
| JP | H09165212 A | | 6/1997 | |
| JP | H10182125 A | | 7/1998 | |
| JP | H10245216 A | | 9/1998 | |
| JP | H1192284 A | | 4/1999 | |
| JP | 2006240914 A | | 9/2006 | |
| JP | 2006289448 A | * | 10/2006 | ........... B22D 11/115 |
| JP | 2008254039 A | | 10/2008 | |
| WO | 2006082085 A2 | | 8/2006 | |
| WO | 2007148988 A1 | | 12/2007 | |
| WO | WO 2007148988 A1 | * | 12/2007 | ............. C30B 35/00 |
| WO | 2008031229 A1 | | 3/2008 | |

OTHER PUBLICATIONS

Notice of Reasons for Rejection from the Japanese Patent Office Application No. 2012-529132 Issued: Jul. 30, 2013 8 pages.

* cited by examiner

APPARATUS AND METHOD FOR CRYSTALLIZATION OF SILICON

CROSS-REFERENCE TO RELATED APPLICATIONS

The present application is a continuation of pending International patent application PCT/EP2009/062099 filed on Sep. 18, 2009, which designates the United States and the content of which is incorporated herein by reference.

FIELD OF THE INVENTION

The present invention generally relates to crystallization of silicon, particularly silicon used in photovoltaic cells.

BACKGROUND OF THE INVENTION

WO 2007/148988 discloses a method and a furnace for crystallization of silicon for photovoltaic cells. The furnace comprises a crucible or a plurality of crucibles for containing the silicon, a heating device for heating the crucible, a heat discharging device for discharging the heat from the crucible, and a stirring device comprising an electromagnetic device supplied with an alternating current for applying an alternating electromagnetic field to the crucible.

The stirring of the silicon melt during the crystallization of the silicon is of outermost importance to remove a large amount of impurities while obtaining a unidirectional growth of the silicon. The prior art apparatus does not seem to disclose optimum stirring in order to obtain the purest silicon possible for use in photovoltaic cells.

SUMMARY OF THE INVENTION

It is an object of the present invention to provide an apparatus and a method, respectively, for crystallization, which address the above issues.

It is a particular object of the invention to provide such apparatus and method, which provide for an increased purity of the crystallized silicon while a unidirectional solidification front is maintained.

It is a further object of the invention to provide such apparatus and method, by which the stirring can be dynamically controlled during the crystallization.

It is yet a further object of the invention to provide such apparatus and method, which are simple, robust, reliable, and of low cost.

These objects among others are, according to the present invention, attained by apparatuses and methods as claimed in the appended patent claims.

The term "speed of molten silicon" refers to the speed of the molten silicon circulating within a crucible when it is stirred by an electromagnetic stirring device.

According to a first aspect of the invention there is provided an apparatus comprising a crucible for containing silicon, a heating and heat dissipating arrangement provided for melting the silicon contained in the crucible and for subsequently solidifying the molten silicon, and an electromagnetic stirring device provided for stirring the molten silicon in the crucible during the solidification of the molten silicon. A control arrangement is provided for controlling the heating and heat dissipating arrangement to solidify the molten silicon at a specified solidification rate and for controlling the electromagnetic stirring device to stir the molten silicon in response to the specified solidification rate of the molten silicon such that the ratio of a speed of the molten silicon and the solidification rate is above a first threshold value. The first threshold value may be 10, 100, 1000 or 10 000 depending on the composition of the raw material silicon and/or on the intended application of the crystallized silicon. Further, the control arrangement may be provided to control the speed of the molten silicon to be below a second threshold value.

In one embodiment the control arrangement is provided for controlling the electromagnetic stirring device to stir the molten silicon in the crucible during two stages such that a first speed of the molten silicon is obtained in a first one of the stages and a second speed of the molten silicon is obtained in a second one of the stages, wherein the first speed of the molten silicon is higher than the second speed of the molten silicon. The above controlled solidification is performed during the second stage. During the first stage the control arrangement is provided for controlling the heating and heat dissipating arrangement to keep the silicon contained in the crucible molten to allow impurities to be transported in the molten silicon. Alternatively, the control arrangement is, during the first stage, provided for controlling the heating and heat dissipating arrangement to solidify the molten silicon, to cut a way a portion thereof, and to subsequently re-melt the remaining solidified silicon.

In a further embodiment of the invention the electromagnetic stirring device is capable of altering the direction of its stirring and the control arrangement is provided for controlling the electromagnetic stirring device to alter the direction of the stirring of the molten silicon in the crucible during the solidification of the molten silicon.

According to a second aspect of the invention there is provided a method according to which silicon is arranged in a crucible. The silicon in the crucible is molten and subsequently the molten silicon is solidified while the molten silicon in the crucible is stirred by means of an electromagnetic stirring device. The molten silicon is solidified at a specified solidification rate and the stirring by the electromagnetic stirring device is controlled in response to the step of solidifying such that the ratio of a speed of the molten silicon and the solidification rate is above a first threshold value. The stirring of the molten silicon in the crucible by the electromagnetic stirring device may be performed in two stages, wherein the stirring is heavier during the first stage and at least the second stage comprises solidifying molten silicon.

By means of the present invention a clean solidification front can be obtained and remixing of impurities at the silicon melt surface is avoided. Simultaneously, a unidirectional solidification front can be achieved.

Further characteristics of the invention, and advantages thereof, will be evident from the following detailed description of preferred embodiments of the present invention given hereinafter and the accompanying FIGS. 1-4, which are given by way of illustration only, and are thus not limitative of the present invention.

DETAILED DESCRIPTION OF THE INVENTION

Figure 1:
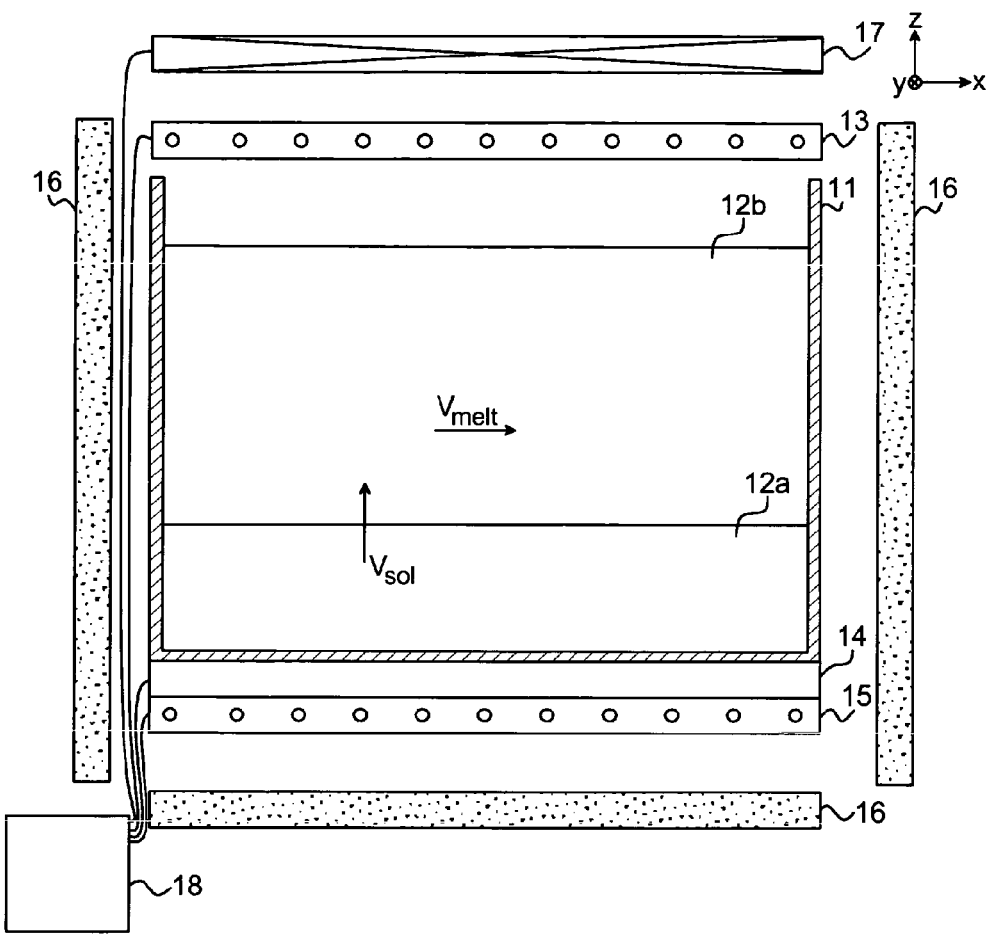
FIG. 1 displays schematically in a cross-sectional side elevation view an apparatus for crystallization of silicon according to one embodiment of the invention.

In FIG. 1 is illustrated an apparatus for crystallization of solar grade silicon to polycrystalline silicon. The apparatus comprises a crucible 11 for containing the solar grade silicon (low purity silicon). The crucible 11 is, during crystallization, arranged in a vacuum furnace (not illustrated) comprising a housing and a top cover which can be removed for loading and unloading. Seals are provided to render the furnace gas tight. Further, fluid inlet(s) and outlet(s) may be provided in order to keep an inert atmosphere in the furnace and optionally to assist in heat dissipation during the crystallization.

The raw material is placed in the crucible before the crystallization process starts. In FIG. 1 is shown a layer of solid crystalline silicon 12a and a layer of molten silicon 12b above the solid crystalline silicon 12a.

The apparatus further comprises a heating devices 13, 15, a cooling or heat dissipating device 14, and heat isolation devices 16 for providing suitable temperatures and temperature gradients in the crucible during the crystallization process. The heating devices 13, 15 are also provided for causing the raw material to melt.

While the heating devices 13, 15 are illustrated as two devices placed above and below the crucible, the present invention is applicable to apparatuses having only one heating device and more than two heating devices and/or wherein the heating device(s) is/are arranged differently.

The heating devices 13, 15 may be based on electric heating elements, for example supplied with a direct current or a single phase or three phase alternating current. The heating devices 13, 15 may be conventional heating elements or induction heating elements or a combination of both.

The cooling or heat dissipating device 14 is arranged directly below the crucible 11 and is arranged to dissipate heat from the crucible 11 for the solidification of the raw material silicon therein. The cooling or heat dissipating device 14 may be realized as a device for circulation of a cooled gas as disclosed in WO 2006/082085 or by circulation of a cooling liquid. Alternatively, the cooling or heat dissipating device 14 is a heat conducting device for conducting heat away from the lower part of the crucible 11. Yet alternatively, the cooling or heat dissipating device 14 is a device with movable parts for convection of heat away from the lower part of the crucible 11.

The heat isolation devices 16 are provided for reducing the heat required for melting the raw material silicon and for allowing the temperature field to be accurately and precisely controlled. In one embodiment the heat isolation devices 16 are movable or capable of altering their heat isolation properties in order to assist in the dissipation of heat from the crucible 11 during the solidification process.

The heating devices 13, 15, the cooling or heat dissipating device 14, and optionally the heat isolation devices 16 are in the following referred to as a heat and heat dissipating arrangement.

Further, the inventive apparatus comprises an electromagnetic stirring device 17 provided for stirring the molten silicon 12b in the crucible during the solidification of the molten silicon 12b in order to affect the distribution of doping atoms as well and avoid impurities to crystallize into the ingot of solidified silicon. The largest amount of impurities is collected at the top of the ingot and is removed before the ingot is sliced into silicon wafers to be used in photovoltaic cells.

The electromagnetic stirring device 17 comprises one or several electromagnetic devices supplied with an alternating current for applying an alternating electromagnetic field to the molten silicon 12b in the crucible 11. The electromagnetic device can for example comprise coils or other types of electrically conducting rails suitable to provide a sufficient alternating electromagnetic field when supplied with an alternating current.

Any material or parts located between the electromagnetic stirring device 17 and the silicon melt should be made of a nonmagnetic material such as austenitic steel, a ceramic, or a polymer in order to not increase the magnetic resistance for the electromagnetic stirring device 17.

The heat and heat dissipating arrangement and the electromagnetic stirring device 17 are connected to a suitable power supply arrangement.

A control arrangement 18 is operatively connected to the heat and heat dissipating arrangement and to the electromagnetic stirring device 17 for control thereof during the crystallization process. The control arrangement 18 is suitably realized as one or more microcomputers provided with suitable software and input data regarding the structure of the apparatus, the composition of the raw material silicon, and specified solidification rate and amount of stirring. In FIG. 1 the solidification rate $v_{sol}$ is indicated as a vertical arrow and the amount of stirring expressed as a velocity $v_{mel}$ of the molten silicon 12b is indicated as a horizontal arrow. Typically, the solidification is performed from below and upwards. The stirring forces are typically applied in a horizontal direction. The speed $v_{mel}$ of the molten silicon 12b may be expressed as a highest speed of the molten silicon, an average speed of the molten silicon, a highest speed of a portion of the molten silicon, or an average speed of a portion of the molten silicon. The portion may be a portion located at or above but close to the solidification front of the crystallized silicon 12a.

The speed $v_{mel}$, of the molten silicon 12b can easily be controlled since it is proportional to the current in the electromagnetic stirring device 17 for a given height of the molten silicon and the solidification rate can easily be controlled since it is proportional to the difference of the heat supplied to, and the heat removed from, the solidification front.

According to one embodiment the control arrangement 18 is provided for controlling the heating and heat dissipating arrangement to melt the raw material silicon and to subsequently solidify the molten silicon at a specified solidification rate $v_{sol}$ and for controlling the electromagnetic stirring device 17 to stir the molten silicon 12b in response to the solidification rate $v_{sol}$ of the molten silicon such that the ratio of a speed $v_{mel}$ of the molten silicon and the solidification rate $v_{sol}$ is above a first threshold value TV1, that is:

$$V_{mel}/V_{sol} > TV1$$

The first threshold value TV1 may be 10, 100, 1000 or 10 000 depending on the composition of the raw material silicon and/or on the intended application of the crystallized silicon. By means of relating the stirring to the solidification rate according to the above expression a clean and unidirectional solidification front can be achieved.

Optionally, the ratio $V_{mel}/V_{sol}$ should be below a second threshold value TV2, that is:

$$V_{mel}/V_{sol} < TV2$$

The second threshold value TV2 may be 100 000, 50 000 or 30 000 depending on the composition of the raw material silicon and/or on the intended application of the crystallized silicon.

The control arrangement 18 is preferably provided to control the speed of the molten silicon to be below a third threshold value TV3, that is a maximum speed. This speed is preferably in the range of 1 cm/s to 30 cm/s.

By means of keeping the stirring below a maximum allowed level (related or not related to the solidification rate) a unidirectional solidification front can be achieved.

In another embodiment the control arrangement 18 is provided for controlling the electromagnetic stirring device 17 to stir the molten silicon 12b in the crucible 11 during two stages such that a first speed $v_1$ of the molten silicon is obtained in a first one of the stages and a second speed $v_2$ of the molten silicon is obtained in a second one of the stages, wherein the first speed of the molten silicon is higher than the second speed of the molten silicon, that is:

$$v_1 > v_2$$

During the second stage the control arrangement is preferably provided for controlling the heating and heat dissipating arrangement to obtain a specified solidification rate of the molten silicon and for controlling the electromagnetic stirring device to obtain a speed of the molten silicon in response to the solidification rate such that the ratio of the speed of the molten silicon and the solidification rate is fulfilling any of the above expressions containing the first and second threshold values.

During the second stage the control arrangement 18 is preferably provided to control the speed of the molten silicon to be below the third threshold value TV3.

Typical operation data during the second stage are: speed of the molten silicon $v_{mel}$ of 0.05 m/s and a solidification rate $v_{sol}$ of 10 mm/h. This gives a ratio $v_{mel}/v_{sol}$ of 18 000.

During the first stage the control arrangement 18 is provided for controlling the heating and heat dissipating arrangement to keep the silicon contained in the crucible molten to allow impurities to be transported in the molten silicon. Inclusions in the melt such as oxygen, carbon, oxides, and carbides can be transported from the interior of the melt up to the melt surface.

Alternatively, the control arrangement 18 is, during the first stage, provided for controlling the heating and heat dissipating arrangement to solidify the molten silicon, to cut away a top portion thereof, and to subsequently re-melt the remaining solidified silicon. Hereby a double casting process is achieved. In the first solidification (during the first stage) the crystal quality and the unidirectional growth of the silicon are not critical and therefore an increased stirring and possibly also a higher solidification rate can be used.

In a further embodiment, the control arrangement 18 is provided for controlling the electromagnetic stirring device 17 to obtain an altered speed of the molten silicon and for controlling the heating and heat dissipating arrangement to alter its heating and heat dissipating in response to the altered speed of the molten silicon, preferably while maintaining the solidification rate. Preferably, the speed is increased while the heat supplied to, and the heat removed, from the solidification front are reduced while the difference of the heat supplied to, and the heat removed, from the solidification front is kept substantially unchanged. Hereby, a more homogenous temperature at the solidification front is obtained at increased stirring.

In still a further embodiment the control arrangement 18 is provided for controlling the electromagnetic stirring device 17 to obtain an altered, preferably increased, speed of the molten silicon and for controlling the heating and heat dissipating arrangement to alter its heating and heat dissipating in response to the altered speed of the molten silicon such that the ratio of a speed of the molten silicon and the specified solidification rate is kept substantially unchanged.

An increased stirring during solidification in a latter part of the crystallization process is advantageous to avoid high concentration of doping atoms in the molten silicon. Reduced stirring in the beginning of the crystallization process increases the amount of doping atoms in the lower portion of the solidified silicon (ingot).

Figure 2:
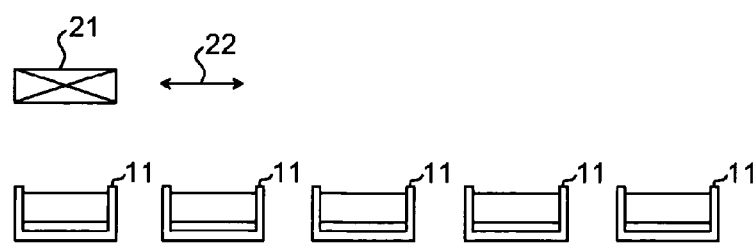
FIG. 2-4 display schematically in side elevation views apparatuses for crystallization of silicon according to alternative embodiments of the invention.
Figure 3:
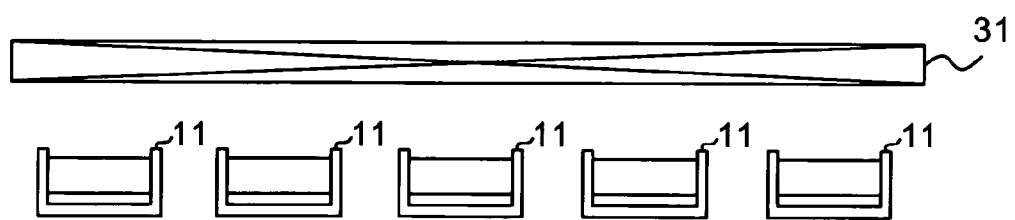
Figure 4:
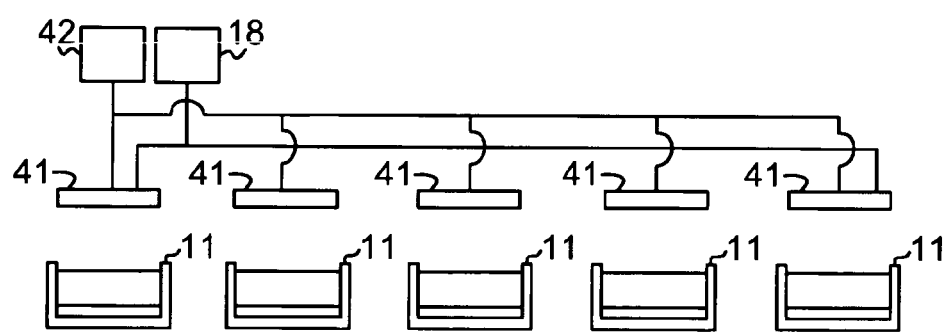

FIGS. 2-4 display schematically in side elevation views apparatuses for crystallization of silicon according to alternative embodiments of the invention. Each of the apparatuses comprises a plurality of crucibles 11 and heat and heat dissipating arrangements for melting and solidifying silicon in the crucibles 11. The crucibles 11 and the heat and heat dissipating arrangements are housed in a vacuum furnace (not illustrated).

The embodiment of FIG. 2 comprises an electromagnetic stirring device 21 which is movable horizontally according to double arrow 22 along the crucibles 11 with respect to one another such that the electromagnetic stirring device 21 can stir the molten silicon in the crucibles 11, one after the other, during the solidification of the molten silicon. The electromagnetic stirring device 21 may be movable along rails mounted in the ceiling of the vacuum furnace by means of an electric motor.

The embodiment of FIG. 3 comprises an electromagnetic stirrer device 31 which is adapted in shape and sized to the number of the crucibles 11 such that the electromagnetic stirrer device 31 can stir the molten silicon in all the crucibles 11 concurrently during the solidification of the molten silicon.

The embodiment of FIG. 4 comprises a power source 42 and a plurality of electromagnetic stirrer units 41, the number of which corresponds to the number of the crucibles 11. Each of the electromagnetic stirrer units 41 is powered by the common power source 42 and is adapted to stir the molten silicon in a respective one of the crucibles 11 during the solidification of the molten silicon. Typically, each of the electromagnetic stirrer units 41 is controlled by a single controller.

A method for crystallization of silicon is provided according to a yet further embodiment of the invention. According to the method silicon is, in a first step, arranged in a crucible. The silicon contained in the crucible is, in a second step, molten. Subsequently, the molten silicon is, in a third step, solidified while the molten silicon in the crucible is stirred by means of an electromagnetic stirring device. In the third step, solidification of the molten silicon is controlled at a specified solidification rate and the stirring by the electromagnetic stirring device is controlled in response to the solidification rate such that the ratio of a speed of the molten silicon and the solidification rate is above a first threshold value. The control may be performed automatically by a control device, semi-automatically, or manually. This embodiment of the invention may be modified according to any other of the embodiments of the present invention.

A problem of a typical prior art apparatus for crystallization of silicon is that the solidification of the silicon is uneven along the solidification front leading to deteriorated performance of the photovoltaic cells manufactured from the crystallized silicon.

To solve the above problem and to promote a unidirectional growth of the silicon an apparatus for crystallization of silicon is provided, which is identical with the apparatus illustrated in FIG. 1 but in which the control arrangement 18 is provided for controlling the electromagnetic stirring device 17 in a novel manner. During the solidification of the molten silicon the control arrangement 18 is arranged to control the electromagnetic stirring device 16 to alter the direction of its stirring, preferably repeatedly or continuously.

In one embodiment the direction of the stirring of the electromagnetic stirring device 17 is reversed, preferably by means of reversing the current in the electromagnetic stirring device 17.

In another embodiment, the electromagnetic stirring device 17 comprises electric circuitry and a rotating device provided for rotating the electric circuitry under control of the control arrangement 18, thereby rotating the direction of the stirring of the molten silicon in the crucible during the solidification of the molten silicon.

The altering of direction of the stirring during the solidification of the molten silicon provides a more homogenous temperature profile at the solidification front, which promotes the unidirectional growth of the silicon.

What is claimed is:

1. An apparatus for crystallization of silicon comprising:
   a crucible for containing silicon;
   a heating and heat dissipating arrangement provided for melting the silicon contained in the crucible and for subsequently solidifying the molten silicon;
   an electromagnetic stirring device provided for stirring the molten silicon in the crucible and causing the molten silicon to circulate within the crucible during the solidification of the molten silicon,
   a control arrangement comprising one or more microcomputers, said control arrangement operatively connected to the heat and heat dissipating arrangement and to the electromagnetic stirring device, and
   software executing on the one or more microcomputers,
   said one or more microcomputers being configured to receive input data,
   said software being configured to control the electromagnetic stirring device to stir the molten silicon in two stages such that a first speed of the molten silicon circulating within the crucible is obtained in a first stage of the two stages and a second speed of the molten silicon circulating within the crucible is obtained in a second stage of the two stages, the first speed of the molten silicon circulating within the crucible being higher than the second speed of the molten silicon circulating within the crucible,
   said software being configured to control the heating and heat dissipating arrangement to solidify the molten silicon at a specified solidification rate,
   said software being further configured to control the electromagnetic stirring device to stir the molten silicon at a speed in response to the specified solidification rate of the molten silicon such that the ratio of the speed of the molten silicon circulating within the crucible and the specified solidification rate is above a first threshold value, wherein the first threshold value is at least 10.

2. The apparatus of claim 1 wherein said control arrangement is provided to stir the molten silicon in response to the specified solidification rate of the molten silicon such that the ratio of a speed of the molten silicon circulating within the crucible and the specified solidification rate is below a second threshold value which is higher than said first threshold value, wherein the second threshold value is 100,000 or less.

3. The apparatus of claim 1 wherein the speed of the molten silicon circulating within the crucible is a highest speed of the molten silicon circulating within the crucible, an average speed of the molten silicon circulating within the crucible, a highest speed of a portion of the molten silicon circulating within the crucible, or an average speed of a portion of the molten silicon circulating within the crucible located at or close to a solidification front of the solidifying molten silicon.

4. The apparatus of claim 1 wherein said control arrangement is, during the second stage, provided for controlling the heating and heat dissipating arrangement to obtain the specified solidification rate of the molten silicon and for controlling the electromagnetic stirring device to obtain the speed of the molten silicon circulating within the crucible in response to the specified solidification rate such that the ratio of the speed of the molten silicon circulating within the crucible and the specified solidification rate is within said specified range.

5. The apparatus of claim 1, wherein said control arrangement is, during the second stage, provided to control the speed of the molten silicon circulating within the crucible to be below a third threshold value.

6. The apparatus of claim 1, wherein said control arrangement is, during the first stage, provided for controlling the heating and heat dissipating arrangement to keep the silicon contained in the crucible molten to allow impurities to be transported in the molten silicon.

7. The apparatus of claim 1, wherein the control arrangement is, during the first stage, provided for controlling the heating and heat dissipating arrangement to solidify the molten silicon, to cut away a portion thereof, and to subsequently melt the remaining solidified silicon.

8. The apparatus of claim 1 wherein said electromagnetic stirring device is capable of altering the direction of its stirring and said control arrangement is provided for controlling the electromagnetic stirring device to alter the direction of the stirring of the molten silicon in the crucible during the solidification of the molten silicon.

9. The apparatus of claim 1 wherein said control arrangement is provided for controlling the electromagnetic stirring device to obtain an altered speed of the molten silicon circulating within the crucible and for controlling the heating and heat dissipating arrangement to alter its heating and heat dissipating in response to said altered speed of the molten silicon circulating within the crucible while maintaining said specified solidification rate.

10. The apparatus of claim 1 wherein said control arrangement is provided for controlling the electromagnetic stirring device to obtain an increased speed of the molten silicon circulating within the crucible during the solidification of the molten silicon.

11. An apparatus comprising:
    a plurality of crucibles for containing silicon;
    a heating and heat dissipating arrangement provided for melting the silicon contained in the plurality of crucibles and for subsequently solidifying the molten silicon;
    an electromagnetic stirring device provided for stirring the molten silicon in the plurality of crucibles and causing the molten silicon to circulate within the plurality of crucible during the solidification of the molten silicon,
    rails, and
    an electric motor operatively connected with said electromagnetic stirring device, said electromagnetic stirring device movable along said rails by the operation of said electric motor for stirring the molten silicon in the plurality of crucibles one after the other during the solidification of the molten silicon, and
    a control arrangement comprising one or more microcomputers, said control arrangement operatively connected to the heat and heat dissipating arrangement and to the electromagnetic stirring device, and
    software executing on the one or more microcomputers,
    said one or more microcomputers being configured to receive input data,
    said software being configured to control the electromagnetic stirring device to stir the molten silicon in two stages such that a first speed of the molten silicon circulating within the crucible is obtained in a first stage of the two stages and a second speed of the molten silicon circulating within the crucible is obtained in a second stage of the two stages, the first speed of the molten silicon circulating within the crucible being higher than the second speed of the molten silicon circulating within the crucible, said software being configured to control the heating and heat dissipating arrangement to solidify the molten silicon at a specified solidification rate, said software being further configured to control the electromagnetic stirring device to stir the molten silicon at a speed in response to the specified solidification rate of the molten silicon such that the ratio of the speed of the molten silicon circulating within the plurality of crucible and the specified solidification rate is above a first threshold value, wherein the first threshold value is at least 10.

12. The apparatus of claim 11 wherein the size of the electromagnetic stirrer device is adapted to the number of said plurality of crucibles such that the electromagnetic stirrer device can stir the molten silicon in the plurality of crucibles concurrently during the solidification of the molten silicon.

13. The apparatus of claim 11 wherein
the electromagnetic stirrer device comprises a power source and a plurality of electromagnetic stirrer units, the number of which corresponding to the number of the crucibles; and
each of the electromagnetic stirrer units is powered by the power source and is adapted to stir the molten silicon in a respective one of the crucibles during the solidification of the molten silicon.

14. An apparatus for crystallization of silicon comprising:
a crucible for containing silicon;
a heating and heat dissipating arrangement provided for melting the silicon contained in the crucible and for subsequently solidifying the molten silicon; and
an electromagnetic stirring device provided for stirring the molten silicon in the crucible during the solidification of the molten silicon,
a control arrangement comprising one or more microcomputers, said control arrangement operatively connected to the heat and heat dissipating arrangement and to the electromagnetic stirring device, and
software executing on the one or more microcomputers,
said one or more microcomputers being configured to receive input data,
said software being configured to control the electromagnetic stirring device to stir the molten silicon in two stages such that a first steed of the molten silicon circulating within the crucible is obtained in a first stage of the two stages and a second speed of the molten silicon circulating within the crucible is obtained in a second stage of the two stases the first steed of the molten silicon circulating within the crucible being higher than the second speed of the molten silicon circulating within the crucible, wherein said electromagnetic stirring device is provided for altering the direction of its stirring of the molten silicon in the crucible during the solidification of the molten silicon through the control of the control arrangement.

15. The apparatus of claim 14 wherein said control arrangement is provided for reversing a current in the electromagnetic stirring device, thereby reversing the direction of its stirring of the molten silicon by the electromagnetic stirring device in the crucible during the solidification of the molten silicon.

16. The apparatus of claim 14 wherein said electromagnetic stirring device comprises electric circuitry and a rotating device provided for rotating said electric circuitry, thereby rotating the direction of the stirring of the molten silicon in the crucible during the solidification of the molten silicon.

17. The apparatus of claim 14 wherein said electromagnetic stirring device is provided for altering the direction of its stirring of the molten silicon in the crucible during the solidification of the molten silicon repeatedly or continuously.

18. The apparatus of claim 1 wherein the first threshold value is at least 100.

19. The apparatus of claim 1 wherein the first threshold value is 10,000.

20. The apparatus of claim 2 wherein the second threshold value is at least 30,000.

21. The apparatus of claim 1, wherein said control arrangement is provided for controlling the electromagnetic stirring device to alter the direction of its stirring of the molten silicon in the crucible during the solidification of the molten silicon through the control of the control arrangement.

22. The apparatus of claim 21, wherein said control arrangement is provided for reversing a current in the electromagnetic stirring device, thereby reversing the direction of its stirring of the molten silicon by the electromagnetic stirring device in the crucible during the solidification of the molten silicon.

23. The apparatus of claim 21, wherein said electromagnetic stirring device comprises electric circuitry and a rotating device provided for rotating said electric circuitry, thereby rotating the direction of the stirring of the molten silicon in the crucible during the solidification of the molten silicon.

24. The apparatus of claim 1 further comprising a housing for said crucible, wherein said electromagnetic stirring device is mounted in the ceiling of said housing.

25. The apparatus of claim 24 further comprising a heating isolation device, wherein said heating isolation device surrounds the bottom and vertical walls of said crucible and has an opening on the top of said crucible.

* * * * *